United States Patent
Malinen et al.

(10) Patent No.: US 9,869,020 B2
(45) Date of Patent: Jan. 16, 2018

(54) PROTECTING A TARGET PUMP INTERIOR WITH AN ALD COATING

(71) Applicant: Picosun Oy, Espoo (FI)

(72) Inventors: Timo Malinen, Espoo (FI); Harri Vähämäki, Luoma (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 14/783,516

(22) PCT Filed: Apr. 10, 2013

(86) PCT No.: PCT/FI2013/050393
§ 371 (c)(1),
(2) Date: Oct. 9, 2015

(87) PCT Pub. No.: WO2014/033359
PCT Pub. Date: Mar. 6, 2014

(65) Prior Publication Data
US 2016/0076148 A1    Mar. 17, 2016

(51) Int. Cl.
*C23C 16/455* (2006.01)
*C30B 25/02* (2006.01)
(Continued)

(52) U.S. Cl.
CPC ...... *C23C 16/45525* (2013.01); *C23C 16/045* (2013.01); *C23C 16/4412* (2013.01);
(Continued)

(58) Field of Classification Search
CPC ....... C30B 25/00; C30B 25/02; C30B 25/025; C30B 25/08; C30B 25/14; C30B 35/00;
(Continued)

(56) References Cited

U.S. PATENT DOCUMENTS 6,416,577 B1 * 7/2002 Suntoloa ............... C23C 16/045
117/200
7,572,115 B2    8/2009 Klein et al.
(Continued)

FOREIGN PATENT DOCUMENTS

DE    202009004157 U1    11/2009
EP    1666625 A1    6/2006
(Continued)

OTHER PUBLICATIONS

International Search Report. International application No. PCT/FI2013/050393 International filing date (day/month/year) Oct. 4, 2013.
(Continued)

*Primary Examiner* — William P Fletcher, III
(74) *Attorney, Agent, or Firm* — Ziegler IP Law Group, LLC

(57) ABSTRACT

An apparatus and method for protecting a target pump interior, where a target pump (10) inlet is provided with an inlet manifold (20) and a target pump outlet with an exhaust manifold (30). The target pump interior is exposed to sequential self-saturating surface reactions by sequential inlet of reactive gases according to an ALD method via the inlet manifold into the target pump interior and outlet of reaction residue via the exhaust manifold, while the target pump is kept running or not running. A technical effect of the invention is protecting a pump interior, which can be also an assembled pump interior, by a conformal protective coating.

16 Claims, 2 Drawing Sheets

(51) Int. Cl.
*C30B 25/00* (2006.01)
*C30B 35/00* (2006.01)
*C30B 25/08* (2006.01)
*C30B 25/14* (2006.01)
*C23C 16/04* (2006.01)
*C23C 16/44* (2006.01)

(52) U.S. Cl.
CPC .. *C23C 16/45544* (2013.01); *C23C 16/45555* (2013.01); *C30B 25/00* (2013.01); *C30B 25/02* (2013.01); *C30B 25/025* (2013.01); *C30B 25/08* (2013.01); *C30B 25/14* (2013.01); *C30B 35/00* (2013.01); *F04C 2230/91* (2013.01); *F05C 2253/12* (2013.01)

(58) Field of Classification Search
CPC .... Y10T 117/10; Y10S 117/00; C23C 16/045; C23C 16/45525; C23C 16/45544; C23C 16/4412
USPC ............ 117/84, 88, 102, 105, 109, 200; 427/255.28, 255.7
See application file for complete search history.

(56) References Cited

U.S. PATENT DOCUMENTS

| | | |
|---|---|---|
| 2003/0185965 A1 | 10/2003 | Lin et al. |
| 2004/0221807 A1 | 11/2004 | Verghese et al. |
| 2006/0198965 A1 | 9/2006 | Tudhope |
| 2009/0194233 A1 | 8/2009 | Tamura et al. |
| 2012/0219409 A1 | 8/2012 | Corry et al. |

FOREIGN PATENT DOCUMENTS

| | | | |
|---|---|---|---|
| JP | H03199699 A | | 8/1991 |
| JP | 2002158212 A | | 5/2002 |
| JP | 2005109041 A | | 4/2005 |
| JP | 2007-005545 A | * | 1/2007 |
| JP | 2007005545 A | | 1/2007 |
| RU | 2326268 C2 | | 6/2008 |
| TW | I309431 B | | 5/2009 |

OTHER PUBLICATIONS

Extended European Search Report, Application No. 13832495.9-1373/2984206 PCT/FI2013/050393, dated Jan. 2, 2017, 8 pages.
Notification of Ground of Rejection, Japan Patent Application No. 2016507016, dated Oct. 25, 2016, 7 pages.
Office Action Received for Russian Patent Application No. 2015142107/02(064963), dated Apr. 4, 2017, 20 pages including 9 pages of English Translation.
International Preliminary Report on Patentability and Written Opinion received for International Patent Application No. PCT/FI2013/050393, dated Oct. 22, 2015, 11 pages.
Taiwan Patent Office, Office Action, Application No. 103109618, dated Nov. 3, 2017, 6 pages.

* cited by examiner

PROTECTING A TARGET PUMP INTERIOR WITH AN ALD COATING

FIELD OF THE INVENTION

The present invention generally relates to atomic layer deposition (ALD). More particularly, the invention relates to providing protective coating by means of ALD.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to at least one substrate.

Thin films grown by ALD are dense, pinhole free and have uniform thickness. For example, in an experiment aluminum oxide has been grown by thermal ALD from trimethylaluminum $(CH_3)_3Al$, also referred to as TMA, and water resulting in only about 1% non-uniformity over a substrate wafer.

One interesting application of ALD technique is providing protective coatings on surfaces.

SUMMARY

According to a first example aspect of the invention there is provided a method for protecting a target pump interior, the method comprising:

providing a target pump inlet with an inlet manifold and a target pump outlet with an exhaust manifold; and exposing the target pump interior to sequential self-saturating surface reactions by sequential inlet of reactive gases via the inlet manifold into the target pump interior and outlet of reaction residue via the exhaust manifold while the target pump is kept running.

The sequential self-saturating surface reactions (according to ALD) produce the desired protective coating within the pump interior. Accordingly, the target pump interior may be coated by using ALD so that all surfaces within the target pump which see the reactive gases end up coated. The target pump may be running during the whole coating process.

In certain example embodiments, the method comprises attaching the inlet manifold to the target pump inlet and attaching the exhaust manifold to target pump outlet.

In certain example embodiments, the reactive gases and inactive purge gas enter the target pump interior via the inlet manifold. In certain example embodiments, reaction residue and purge gas exit the target pump interior via the exhaust manifold.

The target pump interior may be used as the reaction chamber for ALD reactions. The desired process temperature for ALD reactions may be obtained simply by keeping the target pump running. Additional heating may not be needed. Accordingly, in certain example embodiments, the method comprises providing a required processing temperature by keeping the target pump running without using other heating means.

In certain example embodiments, the inlet manifold comprises ALD reactor in-feed equipment. In certain example embodiments, the in-feed equipment comprises in-feed line(s) and at least the desired precursor and inactive gas flow controlling elements, such as valve(s), mass flow controller(s) or similar, and their control system.

The control system may be implemented for example by software in a laptop computer or similar. Accordingly, in certain example embodiments, the inlet manifold comprises one or more in-feed lines with their controlling elements controlled by a computer-implemented control system. Suitable replaceable precursor and inactive gas sources may be attached to the in-feed equipment.

In certain example embodiments, the exhaust manifold comprises a vacuum pump. In certain example embodiments, the method comprises pumping reaction residue and purge gas from the target pump interior by a vacuum pump attached to the exhaust manifold. The vacuum pump may provide one or more of the following effects: It may be configured to pump reaction residue from the target pump interior via the target pump outlet. It may be used to pump the target pump interior into vacuum.

In certain example embodiments, the target pump is a vacuum pump. In certain example embodiments, the sequential self-saturating surface reactions are performed within a temperature range extending from ambient temperature to 150° C., i.e., the ALD processing temperature is within this range. In certain example embodiments, the ALD processing temperature is within the range of 120° C.-150° C. In certain example embodiments, the processing temperature is achieved by running the target pump itself. In certain other example embodiments, the target pump is instead or additionally heated before and/or during ALD processing by a separate heater.

In certain example embodiments, as mentioned in the foregoing, the type of the target pump is a vacuum pump. In other embodiments, the target pump is of another type. In yet other embodiments, the term pump is construed broadly covering also compressors, the interior of which is coated by the disclosed method.

In certain example embodiments, the method comprises forming a flow channel via target pumps placed in a row, and providing simultaneous protection of the interiors of the target pumps by using the flow channel. In certain example embodiments, the method comprises forming the flow channel by attaching the exhaust manifold of a previous pump to a pump inlet of the following pump in the row.

According to a second example aspect of the invention there is provided an apparatus for protecting a target pump interior, comprising:

an inlet manifold designed to be attached to a target pump inlet; and an exhaust manifold designed to be attached to a target pump outlet, the apparatus, when being used, carrying out the method of the first example aspect or the third example aspect.

Accordingly, the apparatus, when being used, in certain example embodiments is configured to expose the target pump interior to sequential self-saturating surface reactions by sequential inlet of reactive gases via the inlet manifold into the target pump interior and outlet of reaction residue via the exhaust manifold (while the target pump is kept running or kept off).

In certain example embodiments, the inlet manifold comprises precursor vapor and purge gas in-feed lines and their controlling elements.

In certain example embodiments, the exhaust manifold comprises a vacuum pump.

In certain example embodiments, the apparatus is mobile. The protecting apparatus comprising the inlet manifold and the exhaust manifold may be mobile so that it can be moved to meet the user's needs. In certain example embodiments, the inlet manifold and exhaust manifold are separate devices designed to work together in a target pump interior protecting method. In certain example embodiments, the inlet manifold comprises a target pump-specific attachment part to attach to target pump inlet. Accordingly, in certain example embodiments, the inlet manifold comprises a target pump-specific attachment part configured to attach the inlet manifold into the target pump inlet. In certain example embodiments, the exhaust manifold comprises a target pump-specific attachment part to attach to target pump outlet.

According to a third example aspect of the invention there is provided a method for protecting a target pump interior, the method comprising:

providing a target pump inlet with an inlet manifold and a target pump outlet with an exhaust manifold; and exposing the target pump interior to sequential self-saturating surface reactions by sequential inlet of reactive gases via the inlet manifold into the target pump interior and outlet of reaction residue via the exhaust manifold while the target pump is not running.

The target pump not running means the target pump being "off". In certain example embodiments, the sequential self-saturating surface reactions are performed at ambient temperature. In certain other example embodiments, the sequential self-saturating surface reactions are performed at an elevated temperature (i.e., temperature higher than the ambient temperature). In certain example embodiments, the sequential self-saturating surface reactions are performed within a temperature range extending from ambient temperature to 150° C. In certain example embodiments, the target pump is heated before and/or during ALD processing by a separate heater. The embodiments described in connection with the first aspect and their combinations apply also to the third aspect, and vice versa.

Different non-binding example aspects and embodiments of the present invention have been illustrated in the foregoing. The above embodiments are used merely to explain selected aspects or steps that may be utilized in implementations of the present invention. Some embodiments may be presented only with reference to certain example aspects of the invention. It should be appreciated that corresponding embodiments may apply to other example aspects as well. Any appropriate combinations of the embodiments may be formed.

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The basics of an ALD growth mechanism are known to a skilled person. As mentioned in the introductory portion of this patent application, ALD is a special chemical deposition method based on the sequential introduction of at least two reactive precursor species to at least one substrate. The at least one substrate is exposed to temporally separated precursor pulses in the reaction chamber to deposit material on the substrate surfaces by sequential self-saturating surface reactions. In the context of this application, the term ALD comprises all applicable ALD based techniques and any equivalent or closely related technologies, such as, for example MLD (Molecular Layer Deposition) technique.

A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be more complex. For example, the cycles can include three or more reactant vapor pulses separated by purging steps. All these deposition cycles form a timed deposition sequence that is controlled by a logic unit or a microprocessor.

In certain example embodiments as described in the following, there is provided a method and apparatus for protecting a pump's (hereinafter referred to as target pump) interior with a protective coating. The target pump itself forms a reaction chamber, and there is no separate substrate, but the surfaces of the target pump interior form a substrate (substrate here meaning the material on which a process is conducted). All these surfaces can be coated by an ALD process in which precursor vapors are sequentially inlet via an inlet manifold into the target pump interior. The reaction residue is outlet from the target pump interior via an exhaust manifold. The target pump is kept running during the deposition process. The desired process temperature for ALD reactions within the target pump may be obtained simply by keeping the target pump running. In other embodiments, the target pump is "off". In all embodiments, the target pump can be optionally heated before and/or during ALD processing by a heater.

Figure 1:
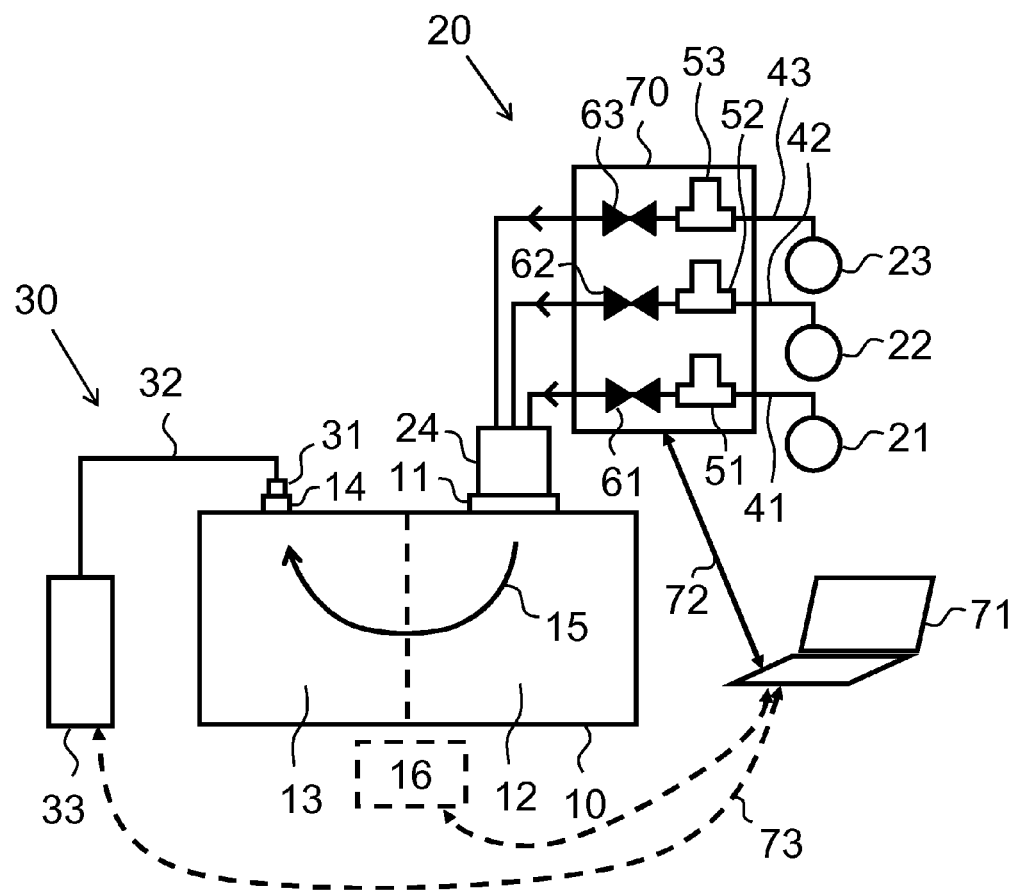
FIG. 1 shows a schematic view of an apparatus and its use in accordance with an example embodiment.

FIG. 1 shows the method and related apparatus in certain example embodiments. The apparatus used to protect the interior of a target pump 10 comprises an inlet manifold 20 and an exhaust manifold 30. The apparatus may be a mobile apparatus. A mobile apparatus may be conveniently moved into the proximity of pumps to be protected, if needed.

The inlet manifold 20 is configured to be attached to the target pump inlet 11. FIG. 1 shows the inlet manifold 20 attached by a first attachment part 24 to the target pump inlet 11. The first attachment part 24 may be a target pump-specific part. The exhaust manifold 30 is configured to be attached to the target pump outlet 14. FIG. 1 shows the exhaust manifold 30 attached by a second attachment part 31 to the target pump outlet 14. The second attachment part 31 may be a target pump-specific part.

The inlet manifold 20 comprises ALD reactor in-feed equipment 70. The in-feed equipment 70 comprises the required in-feed lines and their controlling elements. Attached to the first attachment part 24 in FIG. 1 is a first precursor vapor in-feed line 41, a second precursor in-feed line 42 and a purge gas in-feed line 43. The first precursor in-feed line 41 originates from a first precursor source 21, the second precursor in-feed line 42 from a second precursor source 22, and the purge gas in-feed line 43 from a purge/inactive gas source 23.

The in-feed line controlling elements comprise flow and timing controlling elements. A first precursor in-feed valve 61 and mass flow controller 51 in the first precursor in-feed line 41 control the timing and flow of first precursor pulses. Correspondingly, a second precursor in-feed valve 62 and mass flow controller 52 in the second precursor in-feed line 42 control the timing and flow of second precursor pulses. Finally, a purge gas in-feed valve 63 and mass flow controller 53 control the timing and flow of purge gas.

In the embodiment shown in FIG. 1, the operation of the in-feed equipment 70 is controlled by a control system. FIG. 1 shows a control connection 72 between the in-feed equipment 70 and a control system 71. The control system 71 may be implemented for example by software in a laptop computer or similar.

In certain example embodiments, the ALD process within the target pump interior is performed in a vacuum. The exhaust manifold 30 optionally comprises a vacuum pump 33. In certain example embodiments, the vacuum pump 33 is located in the end of an exhaust line 32 which is attached into the target pump outlet 14. The vacuum pump 33 can be optionally controlled by the control system 71 via an optional electrical connection 73 (which is between the control system 71 and the vacuum pump 33). Depending on the type of the target pump, the vacuum pump 33 pumps the whole interior of the target pump 10 or at least a part of it into vacuum. The target pump 10 can comprise different pressure regions. In FIG. 1, the volumes 12 and 13 depict such regions. The arrow 15 depicts the flow direction within the target pump 10, that is, from target pump inlet 11 via the target pump interior (via volume 12 and then 13, if applicable) to the target pump outlet 14. If the target pump 10, too, is a vacuum pump, the volume 12 in FIG. 1 may be considered as a vacuum pressure region and the volume 13 as an ambient pressure region of the target pump 10. When the target (vacuum) pump 10 is running, the volume 12 stays in vacuum. The exhaust line vacuum pump 33 is then used to pump also the volume 13 into a vacuum.

Further referring to FIG. 1, it should be noted that in other embodiments, the inlet manifold and exhaust manifold 1 may be arranged differently. Instead of separate in-feed lines at least part of the in-feed lines may be in common. The valve types may vary. The flow controlling element locations may vary, etc. For example, three-way valves may be used instead of two-way valves, immediately reflecting changes in in-feed line routing. Concerning the precursor sources and purge gas, their selection depends on the implementation and desired coating. The target pump can be heated by an optional heater 16. The operation of the heater can be optionally controlled be the control system 71 over a connection.

Applicable pump materials are, for example, metals, such as steel and aluminum, but the materials are not limited to these materials. Applicable coatings are, for example, metal oxides, such as aluminum oxide, titanium oxide, tantalum oxide, and tungsten carbide, and their combinations, but the coatings are not limited to these materials. Applicable ALD processing temperatures are ambient temperature—150° C. in certain example embodiments, although other ranges are also applicable. In certain example embodiments, the type of the target pump is a vacuum pump. In other embodiments, the target pump is of another type. In yet other embodiments, the term pump is construed broadly covering also compressors, the interior of which is coated by the disclosed method.

Figure 2:
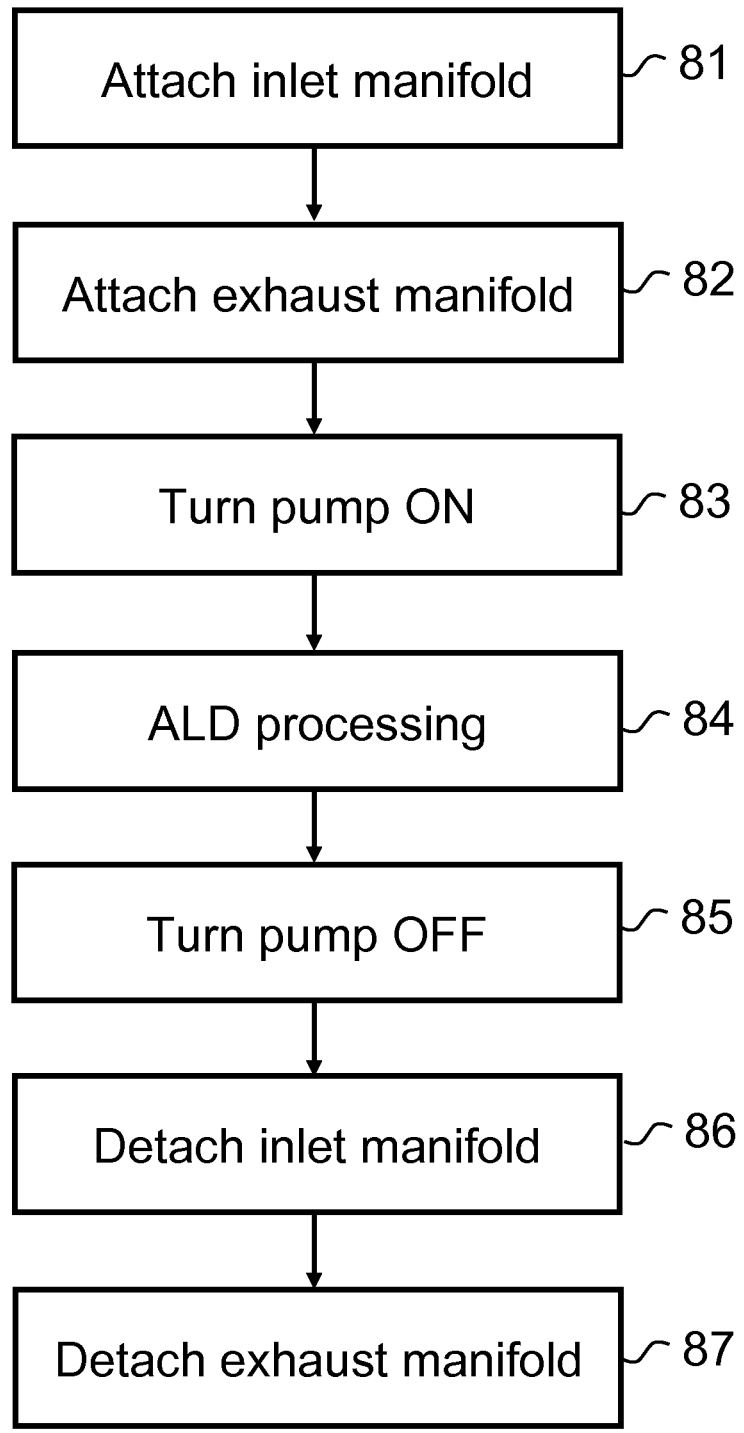
FIG. 2 shows a method in accordance with an example embodiment.

FIG. 2 shows method steps in accordance with what has been disclosed in FIG. 1. First, a mobile pump protecting apparatus is carried next to the target pump 10 to be protected, or the target pump 10 is moved next to the either mobile or fixed pump protecting apparatus. The inlet manifold 20 is attached to target pump inlet 11 (step 81) and the exhaust manifold 30 to target pump outlet 14 (step 82). The target pump 10 is optionally turned on (step 83). The target pump interior is exposed to sequential introduction of precursor vapors, separated by purge steps, in accordance with ALD. The reaction residue and purge gas is pumped into the vacuum pump 33 (step 84). In the deposition process, a conformal protective coating is obtained. The pump is turned off (step 85), and the inlet manifold 20 is detached from target pump inlet 11 (step 86) and the exhaust manifold 30 from target pump outlet 14 (step 87).

In further example embodiments, there is provided pump chain for protecting the pump interiors of the pumps forming the chain. In these embodiments, the inlet manifold is attached to a first target pump inlet similarly as shown in the previous embodiments. A first end of a first exhaust manifold is attached to the first target pump outlet and the opposite end of the exhaust manifold to a second target pump inlet. A first end of a second exhaust manifold is attached to the second target pump outlet and the opposite end to a third target pump inlet, and so on. By this arrangement, a plurality of pumps arranged in a chain can be protected simultaneously by one ALD processing. The gases enter the first target pump interior via the inlet manifold, and the further target pump interiors via the exhaust manifold of the previous pump, until they end up into a vacuum pump placed in the end of the chain. Accordingly, a flow channel is formed via target pumps placed in a row, and simultaneous protection of the interiors of the target pumps is provided by using the flow channel. The target pumps can be vacuum pumps, themselves, or any other applicable pumps.

Without limiting the scope and interpretation of the patent claims, certain technical effects of one or more of the example embodiments disclosed herein are listed in the following: A technical effect is protecting pump interior by a conformal protective coating. Another technical effect is protecting a ready-made (assembled) pump including its sealing surfaces. If the protection would be performed separately for each pump part before assembly, this would make the parts vulnerable to scratches during assembly. Another technical effect is using the target pump itself to provide heating of the target pump interior, by keeping the target pump running during the deposition process.

It should be noted the some of the functions or method steps discussed in the preceding may be performed in a different order and/or concurrently with each other. Furthermore, one or more of the above-described functions or method steps may be optional or may be combined.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method for protecting a target pump interior, the method comprising:
providing a target pump inlet with an inlet manifold and a target pump outlet with an exhaust line by attaching the inlet manifold to the target pump inlet and attaching the exhaust line to the target pump outlet;

exposing the target pump interior to sequential self-saturating surface reactions by sequential inlet of reactive gases via the inlet manifold into the target pump interior and outlet of reaction residue via the exhaust line while the target pump is kept running; and detaching the inlet manifold from the target pump inlet and detaching the exhaust line from the target pump outlet.

2. The method of claim 1, comprising pumping reaction residue and purge gas from the target pump interior by a vacuum pump attached to the exhaust line.

3. The method of claim 1, comprising providing a required processing temperature by keeping the target pump running without using other heating means.

4. The method of claim 1, wherein the inlet manifold comprises one or more in-feed lines with their controlling elements controlled by a computer-implemented control system.

5. The method of claim 1, comprising forming a flow channel via target pumps placed in a row, and providing simultaneous protection of the interiors of the target pumps by using the flow channel.

6. The method of claim 5, comprising forming the flow channel by attaching the exhaust line of a previous pump to a pump inlet of the following pump in the row.

7. The method of claim 1, comprising exposing the target pump interior to sequential self-saturating surface reactions within a temperature range extending from ambient temperature to 150° C.

8. The method of claim 1, wherein the target pump is a vacuum pump.

9. The method of claim 1, wherein the method is implemented by a mobile pump protection apparatus comprising the inlet manifold and exhaust line.

10. A method for protecting a target pump interior, the method comprising:

providing a target pump inlet with an inlet manifold and a target pump outlet with an exhaust line by attaching the inlet manifold to the target pump inlet and attaching the exhaust line to the target pump outlet;

exposing the target pump interior to sequential self-saturating surface reactions by sequential inlet of reactive gases via the inlet manifold into the target pump interior and outlet of reaction residue via the exhaust line while the target pump is not running; and detaching the inlet manifold from the target pump inlet and detaching the exhaust line from the target pump outlet.

11. An apparatus for protecting a target pump interior, comprising:

an inlet manifold designed to be attached to a target pump inlet; and an exhaust line designed to be attached to a target pump outlet, the apparatus, when being used, carrying out the method as defined in claim 1.

12. The apparatus of claim 11, wherein the apparatus, when being used, is configured to expose the target pump interior to sequential self-saturating surface reactions by sequential inlet of reactive gases via the inlet manifold into the target pump interior and outlet of reaction residue via the exhaust line while the target pump is kept running.

13. The apparatus of claim 11, wherein the inlet manifold comprises precursor vapor and purge gas in-feed lines and their controlling elements.

14. The apparatus of claim 11, wherein the exhaust line comprises a vacuum pump.

15. The apparatus of claim 11, wherein the inlet manifold comprises a target pump-specific attachment part configured to attach the inlet manifold into the target pump inlet.

16. The apparatus of claim 11, wherein the apparatus is mobile.

\* \* \* \* \*